(12) United States Patent
Koga et al.

(10) Patent No.: US 9,880,475 B2
(45) Date of Patent: Jan. 30, 2018

(54) LITHOGRAPHY APPARATUS, LITHOGRAPHY METHOD, LITHOGRAPHY SYSTEM, STORAGE MEDIUM, AND ARTICLE MANUFACTURING METHOD

(71) Applicant: CANON KABUSHIKI KAISHA, Tokyo (JP)

(72) Inventors: Shinichiro Koga, Utsunomiya (JP); Noburu Takakura, Utsunomiya (JP); Akihiko Kawamura, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/221,985

(22) Filed: Jul. 28, 2016

(65) Prior Publication Data

US 2016/0334714 A1    Nov. 17, 2016

Related U.S. Application Data

(63) Continuation of application No. 14/334,794, filed on Jul. 18, 2014, now Pat. No. 9,423,700.

(30) Foreign Application Priority Data

Jul. 19, 2013   (JP) ................................ 2013-150054

(51) Int. Cl.
   *G03B 27/42*   (2006.01)
   *G03F 7/20*    (2006.01)
(52) U.S. Cl.
   CPC ...... *G03F 7/70191* (2013.01); *G03F 7/70483* (2013.01)

(58) Field of Classification Search
   CPC .................. G03F 7/70191; G03F 7/70483
   (Continued)

(56) References Cited

U.S. PATENT DOCUMENTS 6,445,441 B1   9/2002   Mouri
6,466,838 B1   10/2002  Aoki
(Continued)

FOREIGN PATENT DOCUMENTS

JP   2000323384 A   11/2000
JP   2000353649 A   12/2000
(Continued)

OTHER PUBLICATIONS

Office Action issued in Korean Application No. KR10-2014-0087391 dated May 24, 2016.
(Continued)

*Primary Examiner* — Hung Henry Nguyen
(74) *Attorney, Agent, or Firm* — Rossi, Kimms & McDowell LLP

(57) ABSTRACT

Provided is a lithography apparatus that includes a plurality of patterning devices each of which is configured to perform patterning for a substrate supplied from a preprocessing apparatus; and a controller configured to control the plurality of patterning devices such that a plurality of substrates respectively belonging to a plurality of lots is subjected to parallel processings by the plurality of patterning devices based on a plurality of recipe information respectively corresponding to the plurality of lots, and transmit information regarding a schedule of the parallel processings to the preprocessing apparatus.

11 Claims, 7 Drawing Sheets

(58) Field of Classification Search
USPC .......................................... 355/27, 53, 67, 77
See application file for complete search history.

(56) References Cited

U.S. PATENT DOCUMENTS

| | | | |
|---|---|---|---|
| 6,698,944 | B2 | 3/2004 | Fujita |
| 9,086,912 | B2* | 7/2015 | Van Kervinck ..... G03F 7/70508 |
| 2005/0137734 | A1 | 6/2005 | Nieuwelaar et al. |
| 2006/0130751 | A1* | 6/2006 | Volfovski ............... G03B 27/32 |
| | | | 118/300 |
| 2007/0147976 | A1* | 6/2007 | Rice .................... G03F 7/70991 |
| | | | 414/217 |
| 2013/0037730 | A1 | 2/2013 | Slot et al. |

FOREIGN PATENT DOCUMENTS

| | | |
|---|---|---|
| JP | 2002075853 A | 3/2002 |
| JP | 2005191571 A | 7/2005 |
| JP | 2006005285 A | 1/2006 |
| JP | 2007180180 A | 7/2007 |
| JP | 4185941 B2 | 11/2008 |
| JP | 2011210992 A | 10/2011 |
| JP | 2012009830 A | 1/2012 |
| JP | 2014515885 A | 7/2014 |

OTHER PUBLICATIONS

Non-Final Office Action issued in U.S. Appl. No. 14/334,794 dated Nov. 30, 2015.
Notice of Allowance issued in U.S. Appl. No. 14/334,794 dated Apr. 22, 2016.
Office Action issued in Japanese Patent Application No. 2013150054 dated Apr. 25, 2017. English translation provided.
Notice of Allowance issued in Korean Patent Application No. 10-2014-0087391 dated Apr. 18, 2017.

* cited by examiner

FIG. 4

```
STATE STORAGE

IMPRINT PATTERNING DEVICE 1
      STATE
      RECIPE NAME
      RECIPE START TIME
      LOT NUMBER
      SUBSTRATE NUMBER
      SUBSTRATE START TIME
      ...

IMPRINT PATTERNING DEVICE 2
      STATE
      RECIPE NAME
      LOT NUMBER
      RECIPE START TIME
      SUBSTRATE NUMBER
      SUBSTRATE START TIME
      ...
...
```

FIG. 5

```
RECIPE STORAGE

RECIPE 1
  SHOT LAYOUT
  IMPRINT SHOT ORDER
  FILLING TIME
  EXPOSURE TIME
  AMOUNT OF COATED RESIN
  ...

RECIPE 2
  SHOT LAYOUT
  IMPRINT SHOT ORDER
  FILLING TIME
  EXPOSURE TIME
  AMOUNT OF COATED RESIN
  ...
...
```

FIG. 6

```
HISTORY STORAGE

IMPRINT PATTERNING DEVICE 1
            RECIPE NAME    SUBSTRATE PROCESSING TIME
            RECIPE NAME    SUBSTRATE PROCESSING TIME
            ...
            RECIPE NAME    SUBSTRATE PROCESSING TIME

IMPRINT PATTERNING DEVICE 2
      ...
```

LITHOGRAPHY APPARATUS, LITHOGRAPHY METHOD, LITHOGRAPHY SYSTEM, STORAGE MEDIUM, AND ARTICLE MANUFACTURING METHOD

BACKGROUND OF THE INVENTION

Field of the Invention

The present invention relates to a lithography apparatus, a lithography method, a lithography system, a storage medium, and an article manufacturing method.

Description of the Related Art

Lithography apparatuses form a pattern for processing on a workpiece (substrate) in a lithography step included in steps of manufacturing articles such as semiconductor devices, MEMSs, and the like. An example of lithography apparatuses includes an imprint apparatus that molds an uncured resin on a substrate using a mold so as to form a resin pattern on the substrate. The imprint apparatus employing a photo-curing method firstly coats an imprint material (photocurable resin) on an imprint region (shot region) on a substrate. Next, the resin (uncured resin) is molded by a mold. After the resin is irradiated with light for curing, the substrate is released from the mold, whereby a resin pattern is formed on the substrate. Japanese Patent No. 4185941 discloses a step-and-flash imprint apparatus.

Japanese Patent Laid-Open No. 2011-210992 discloses a cluster-type lithography system that includes a plurality of lithography apparatuses (e.g., exposure apparatuses or imprint apparatuses) and a transfer unit for transferring a substrate or an original to the plurality of lithography apparatuses for the improvement in productivity.

In the conventional lithography step, a coater/developer that performs preprocessing for coating a resist (photosensitizer) on a substrate and post-processing for developing the exposed substrate is used in addition to an exposure apparatus. From the viewpoint of productivity and maintaining cleanliness of a substrate, the coater/developer is typically used while being connected (so-called "in-line connection") to the exposure apparatus. An imprint apparatus also needs to perform preprocessing for cleaning a substrate, coating an adherence layer on the substrate, and the like prior to forming a pattern on the substrate, the preprocessing apparatus that performs such preprocessing may be used while being connected to the imprint apparatus. In such a case, it is preferable that preprocessing performed by the preprocessing apparatus is carried out immediately before imprint processing performed by the imprint apparatus. The reason for this is that, if dusts are adhered on a substrate upon imprint processing, they may adversely affect a mold or the quality of a pattern for a plurality of imprint regions formed by the mold. This also applies to the case where the adherence layer may change with time. The reasons why it is preferable to perform preprocessing immediately before imprint processing may also be applicable to other lithography apparatuses.

Conventionally, one exposure apparatus is typically in-line connected to one coater/developer. In contrast, there may be a case where the throughput (the number of substrates processed per unit time) of preprocessing apparatuses is higher than that of lithography apparatuses. In this case, so-called a cluster-type lithography apparatus which is connected to one preprocessing apparatus and includes a plurality of lithography apparatuses (or a plurality of lithography units) may be required.

In such a cluster-type lithography apparatus, it is preferable that a plurality of substrates in the same lot is processed by the same apparatus (unit). If such processing is performed, the substrates in the same lot can be processed under the same condition, resulting in the ease of subsequent inspection, processing, and the like. However, it is preferable that a cluster-type lithography apparatus for performing such processing processes a plurality of lots in parallel from the viewpoint of productivity.

On the other hand, it is advantageous to perform preprocessing immediately before lithography processing as close as possible as described above. Thus, in consideration of the yield and productivity of the cluster-type lithography apparatus, it is preferable that the preprocessing apparatus processes a plurality of substrates respectively belonging to a plurality of lots in a timely fashion and then provides them to the lithography apparatus in a timely fashion.

SUMMARY OF THE INVENTION

The present invention provides, for example, a lithography apparatus advantageous in terms of yield and productivity.

According to an aspect of the present invention, a lithography apparatus is provided that includes a plurality of patterning devices each of which is configured to perform patterning for a substrate supplied from a preprocessing apparatus; and a controller configured to control the plurality of patterning devices such that a plurality of substrates respectively belonging to a plurality of lots is subjected to parallel processings by the plurality of patterning devices based on a plurality of recipe information respectively corresponding to the plurality of lots, and transmit information regarding a schedule of the parallel processings to the preprocessing apparatus.

Further features of the present invention will become apparent from the following description of exemplary embodiments with reference to the attached drawings.

BRIEF DESCRIPTION OF THE DRAWINGS

FIG. 4 is a diagram illustrating data recorded in a state storage.

FIG. 5 is a diagram illustrating data recorded in a recipe storage.

FIG. 6 is a diagram illustrating data recorded in a history storage.

DESCRIPTION OF THE EMBODIMENTS

Hereinafter, preferred embodiments of the present invention will be described with reference to the drawings.

Firstly, a description will be given of a lithography apparatus according to one embodiment of the present invention. The lithography apparatus according to the present embodiment is so-called a cluster-type lithography apparatus that includes a plurality of lithography patterning devices each of which performs patterning for a substrate supplied from a preprocessing apparatus to be described below. Hereinafter, in the present embodiment, a description will be given by taking an example of a cluster-type imprint apparatus in which a lithography patterning device is used as an imprint patterning device (imprint apparatus).

Figure 1:
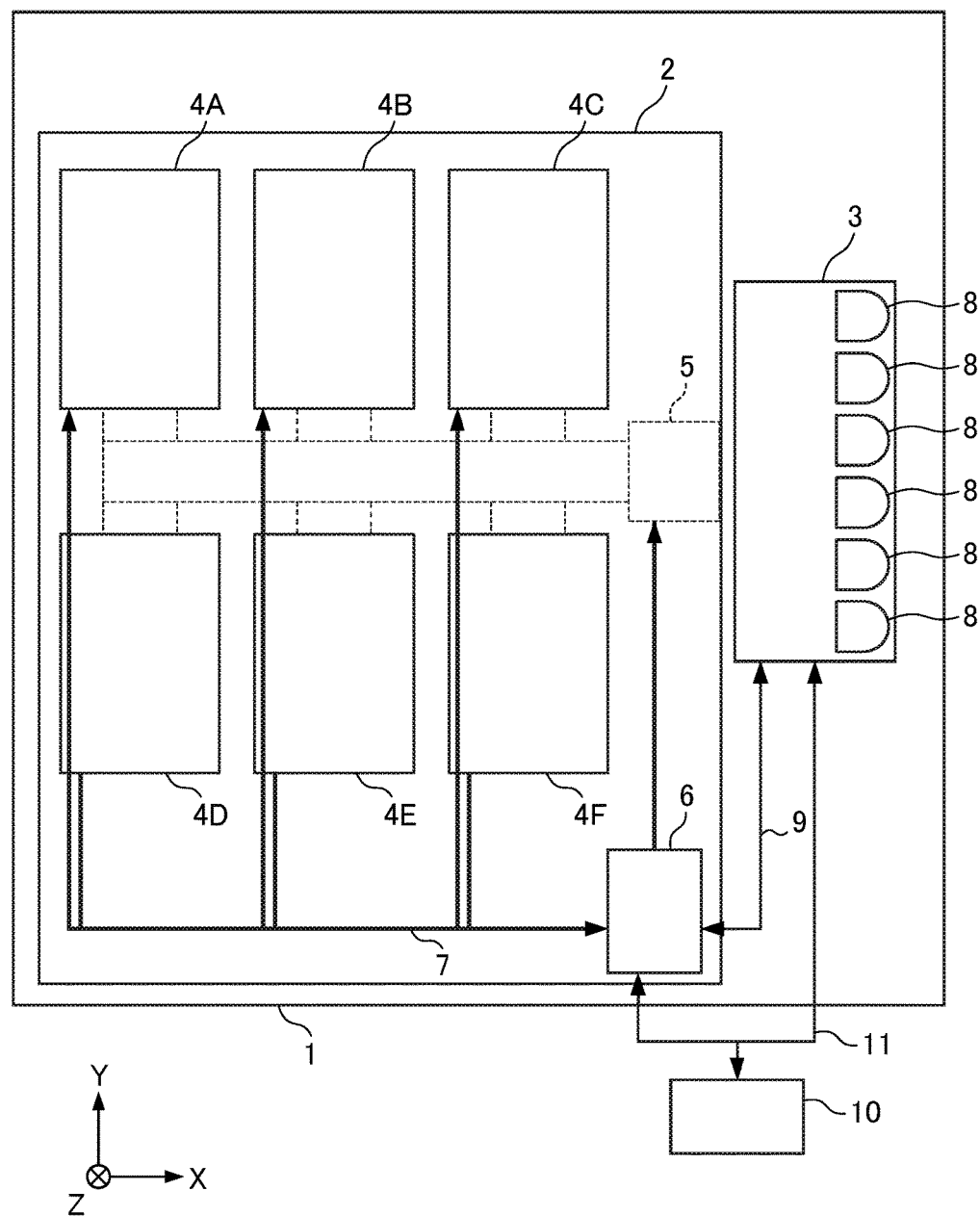
FIG. 1 is a diagram illustrating a configuration of a lithography apparatus according to one embodiment of the present invention.

FIG. 1 is a schematic plan view illustrating configurations of a cluster-type imprint apparatus 2 according to the present embodiment and an imprint system 1 including the cluster-type imprint apparatus 2. The imprint system 1 includes the cluster-type imprint apparatus 2 and a preprocessing apparatus 3. The cluster-type imprint apparatus 2 includes a plurality of (e.g., six in the present embodiment) imprint patterning devices 4 (4A to 4F), a substrate convey unit 5, and a cluster controller 6.

Figure 2:
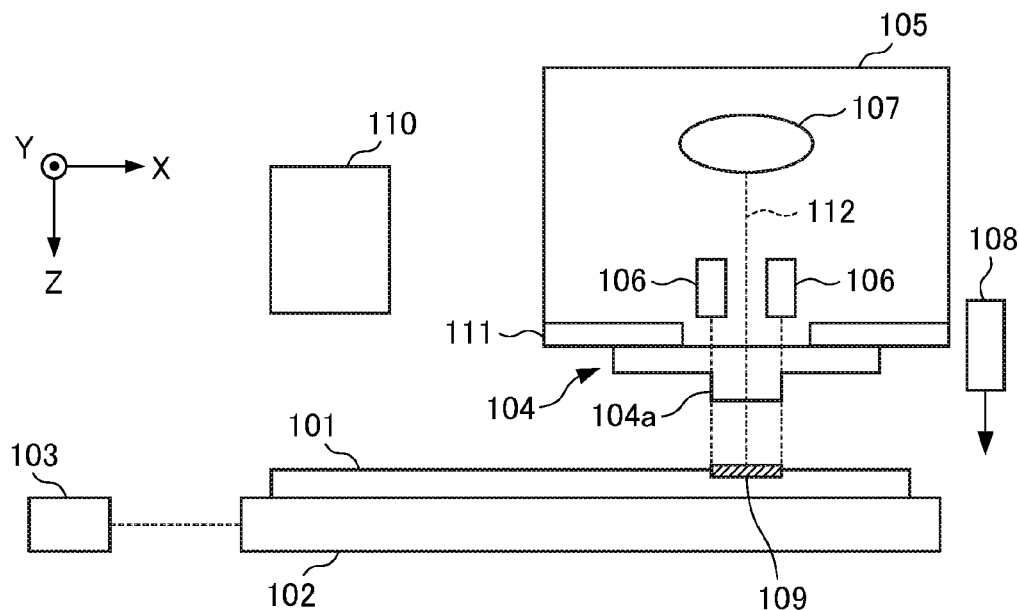
FIG. 2 is a diagram illustrating a configuration of an imprint patterning device.

FIG. 2 is a schematic view illustrating a configuration of a single imprint patterning device (hereinafter simply referred to as "patterning device") 4. The patterning device 4 performs a lithography step from among steps of manufacturing articles such as semiconductor devices. The patterning device 4 molds an uncured resin 109 on a wafer 101 (on a substrate), i.e., a substrate to be processed, using a mold 104 so as to form the pattern formed by the resin 109 on the wafer 101. Here, the patterning device 4 employs a photo-curing method. In the following drawings, a description will be given where the Z axis is aligned parallel to the optical axis of an irradiation system 107 that irradiates the resin 109 on the wafer 101 with ultraviolet light, and mutually orthogonal axes X and Y are aligned in a plane perpendicular to the Z axis. The patterning device 4 includes an irradiation system 107, an imprint structure 105 including a mold holding mechanism 111 and an alignment measuring system 106, a wafer stage 102, a coater 108, and a patterning device controller 110.

The irradiation system 107 adjusts ultraviolet light 112 emitted from a light source into a light suitable for imprint and irradiates the mold 104 with the adjusted ultraviolet light 112 during imprint processing. While lamps such as mercury lamps may be used as the light source, the light source is not particularly limited as long as it emits light that transmits through the mold 104 and has a wavelength at which the resin (ultraviolet curable resin) 109 is cured. While, in the present embodiment, the irradiation system 107 is provided because the photo-curing method is employed, for example, a heat source for curing a thermosetting resin is provided instead of the irradiation system 107 when the heat-curing method is employed.

The outer peripheral shape of the mold 104 is a polygon (preferably, rectangular or square) and the mold 104 includes a pattern section 104a (e.g., the concave and convex pattern of a circuit pattern or the like to be transferred), which is three-dimensionally formed on the surface facing the wafer 101. While there are various pattern sizes depending on the type of articles to be manufactured, a fine pattern size at ten additional nano-scales may also be included. It is preferable that the material of the mold 104 is capable of permitting the passage of the ultraviolet light 112 and has low thermal expansion. An exemplary material of the mold 104 may be quartz.

The mold holding mechanism 111 has a mold chuck that holds the mold 104 and a mold drive mechanism that holds the mold chuck and moves the mold 104, none of which is shown. The mold chuck may hold the mold 104 by suctioning or attracting the outer peripheral region of the surface of the mold 104 irradiated with the ultraviolet light 112 using a vacuum suction force or an electrostatic force. Also, each of the mold chuck and the mold drive mechanism has an aperture region at the central portion (the inside thereof) such that the ultraviolet light 112 emitted from the irradiation system 107 transmits through the mold 104 and directs toward the wafer 101. The mold drive mechanism moves the mold 104 in each axis direction so as to selectively press the mold 104 against the resin 109 on the wafer 101 or release the mold 104 from the resin 109. Examples of a power source employable for the mold drive mechanism include a linear motor, an air cylinder, and the like. The mold drive mechanism may also be constituted by a plurality of drive systems such as a coarse movement drive system, a fine movement drive system, and the like in order to accommodate positioning of the mold 104 with high accuracy. Furthermore, the mold drive mechanism may have a position adjustment function for adjusting the position of the mold 104 not only in the Z-axis direction but also in the X-axis direction, the Y-axis direction, or the θ (rotation about the Z axis) direction, a tilt function for correcting the tilt of the mold 104, and the like. The pressing operation and the releasing operation during imprint processing may be realized by moving the mold 104 in the Z-axis direction, may be realized by moving the wafer stage 102 in the Z-axis direction, or may also be realized by moving both the mold 104 and the wafer stage 102 relative to each other.

The alignment measuring system 106 optically observes an alignment mark pre-formed on the mold 104 and an alignment mark pre-formed on the wafer 101 so as to measure a relative positional relationship therebetween.

The wafer 101 is, for example, a single crystal silicon substrate or an SOI (Silicon on Insulator) substrate, and an ultraviolet curable resin, i.e., the resin 109, which is molded by the pattern section 104a formed on the mold 104, is coated on the treatment surface of the wafer 101.

The wafer stage 102 holds the wafer 101 and executes position matching between the mold 104 and the resin 109 when the mold 104 is pressed against the resin 109 on the wafer 101. The wafer stage 102 has a wafer chuck that holds the wafer 101 by a suction force and a stage drive mechanism that holds the wafer chuck by a mechanical unit and is movable at least in a direction along the surface of the wafer 101, none of which is shown. Examples of a power source employable for the stage drive mechanism include a linear motor, a planar motor, and the like. The power source operates based on a drive command from a stage controller 103. The stage drive mechanism may also be constituted by a plurality of drive systems such as a coarse movement drive system, a fine movement drive system, and the like in the X-axis and Y-axis directions. Furthermore, the stage drive mechanism may also have a drive system for adjusting the position of the wafer 101 in the Z-axis direction, a position adjustment function for adjusting the position of the wafer 101 in the θ direction, a tilt function for correcting the tilt of the wafer 101, and the like.

The coater 108 is installed near the mold holding mechanism 111 and coats the resin (uncured resin) 109 on a shot as a pattern forming region which is present on the wafer 101. Here, the resin 109 is a photocurable resin (imprint material) having the property of being cured by being irradiated with the ultraviolet light 112, and is appropriately selected depending on various conditions for the steps of manufacturing devices or the like. The amount of the resin 109 to be dispensed (ejected) from the coater 108 is also appropriately determined by a desired thickness of the resin 109 to be formed on the wafer 101, the density of the pattern to be formed, or the like.

The patterning device controller 110 controls the operation, adjustment, and the like of the components of the patterning device 4. The patterning device controller 110 includes a calculating unit such as a CPU or a DSP and a storage unit such as a memory or a hard disk for storing recipe information or the like, none of which is shown. Here, recipe information is information (data) consisting of a series of processing parameters used upon processing the wafer 101 or a lot which is a wafer group for which the same processing is performed. Examples of the processing parameters include a layout of shots, the order of shots to be subject to imprint processing, an imprint condition for each shot, and the like. Examples of the imprint condition include a filling time during which the mold 104 is pressed against the resin 109 coated on the wafer 101 and an exposure time during which the resin 109 is cured by being irradiated with the ultraviolet light 112. Another example of the imprint condition includes the coating amount of resin which is the amount of the resin 109 to be coated onto each shot. The patterning device controller 110 receives a recipe from the cluster controller 6, and then performs imprint processing for the wafer 101 carried in by the substrate convey unit 5 based on the recipe.

Referring back to FIG. 1, the substrate convey unit 5 (indicated by a broken line in FIG. 1) conveys (delivers) the wafer 101 between each patterning devices 4 and the preprocessing apparatus 3. Although not specifically shown, the substrate convey unit 5 may be a conveyance robot including hands for holding the wafer 101.

The cluster controller (controller) 6 controls the operation, adjustment, and the like of the components of the cluster-type imprint apparatus 2. The cluster controller 6 is comprised of, for example, an information processing apparatus (computer). The processing (imprint method) according to the present embodiment may be executed as a program by the information processing apparatus. The cluster controller 6 is communicatively connected to the patterning devices 4 and the substrate convey unit 5 via an internal communication line (communication line) 7, and receives/transmits a control signal and various types of information (recipe) from/to the patterning devices 4 and the substrate convey unit 5.

Figure 3:
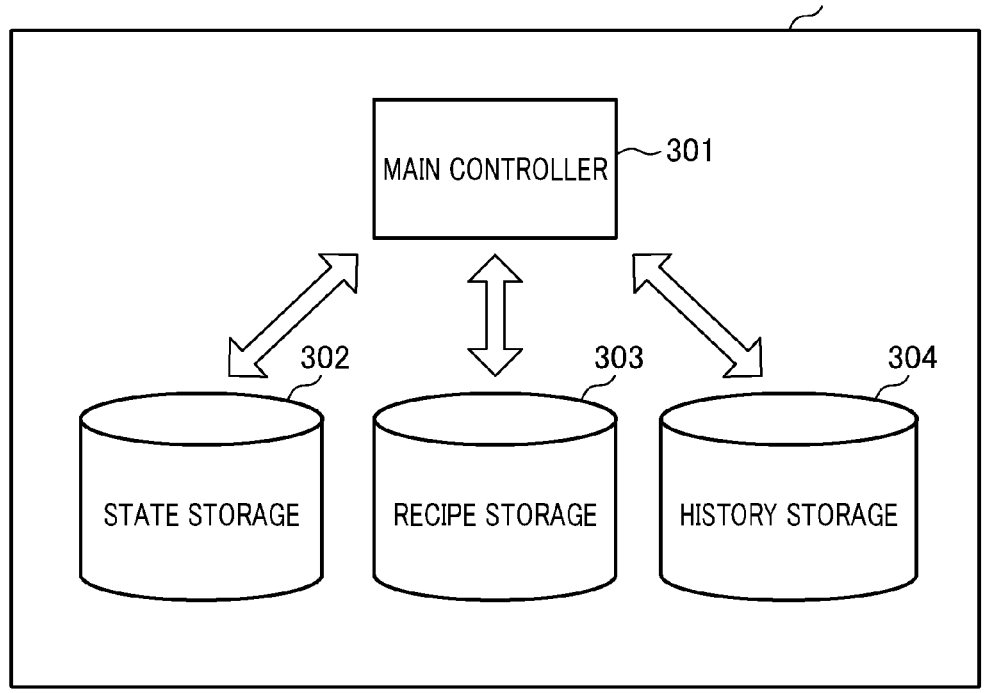
FIG. 3 is a diagram illustrating a configuration of a cluster controller.

FIG. 3 is a conceptual diagram illustrating a configuration of the cluster controller 6. The cluster controller 6 includes a main controller 301, a state storage (storage unit) 302, a recipe storage (storage unit) 303, and a history storage (storage uni) 304. The state storage 302 records the processing state of each patterning device 4. FIG. 4 is a diagram illustrating an example of data recorded in the state storage 302. The state storage 302 records a processing state (processing/waiting for processing/processing-stopped), a recipe name indicating a recipe in process, a recipe start time, a lot number indicating a lot in process, and the like for each patterning device 4. The state storage 302 further records a substrate number indicating the wafer 101 in process, a substrate start time which is a start time of the wafer 101 for which processing starts, and the like. The recipe storage 303 records a plurality of recipes received from an integrated controller 10 (to be described below). FIG. 5 is a diagram illustrating an example of data recorded in the recipe storage 303. The contents which may be recorded in the recipe storage 303 are as described in the description of the patterning device controller 110. The history storage 304 records history information (actual value) about imprint processing performed by the patterning devices 4 in the past. Furthermore, FIG. 6 is a diagram illustrating an example of data recorded in the history storage 304. The history storage 304 records a recipe name of the past imprint processing, a substrate processing time which is a time taken to process each wafer 101, and the like for each patterning device 4. The main controller 301 transmits an instruction to the patterning devices 4 so as to perform imprint processing based on the recipe received from the integrated controller 10 while executing data references and data settings of the state storage 302, the recipe storage 303, and the history storage 304.

Referring again back to FIG. 1, the preprocessing apparatus 3 is a cleaning device or a coating device that performs preprocessing such as cleaning of the wafer 101, coating of an adherence layer, or the like for the wafer 101 in a lot designated by the cluster-type imprint apparatus 2. The preprocessing apparatus 3 may install (house) a substrate storage container (FOUP) 8 for storing the wafers 101 in one lot by the number of the patterning devices 4 which are responsible for processing the wafers 101. Also, a communication connection is established between the cluster controller 6 and the preprocessing apparatus 3 via an external communication line (communication line) 9, and a substrate request schedule to be described below is transmitted/received therebetween. In particular, the preprocessing apparatus 3 starts preprocessing for the wafers 101 in a plurality of lots in any order based on the substrate request schedule so as to complete preprocessing in response to the timing at which the cluster-type imprint apparatus 2 requests the wafers 101 to be processed from the preprocessing apparatus 3. The wafer 101 for which preprocessing has been completed is temporarily stored and is carried out based on a substrate request from the cluster-type imprint apparatus 2.

Furthermore, as in the conventional integrated controller present in a manufacturing location (e.g. semiconductor manufacturing factory) for manufacturing articles (e.g. semiconductor devices) using imprint apparatuses, the integrated controller 10 performs data transmission/reception between various types of manufacturing apparatuses so as to generally control the entire manufacturing steps. As in other manufacturing apparatuses, the imprint system 1 including the cluster-type imprint apparatus 2 according to the present embodiment is connected to the integrated controller 10 via a communication network 11 such as a local area network within a manufacturing location or the like.

Next, a description will be given of the imprint method (lithography method) performed by the imprint system 1 (the cluster-type imprint apparatus 2). Firstly, the cluster controller 6 performs parallel processing to be described below for each of a plurality of requests (a combination of a lot number and a recipe) from the integrated controller 10.

Figure 7:
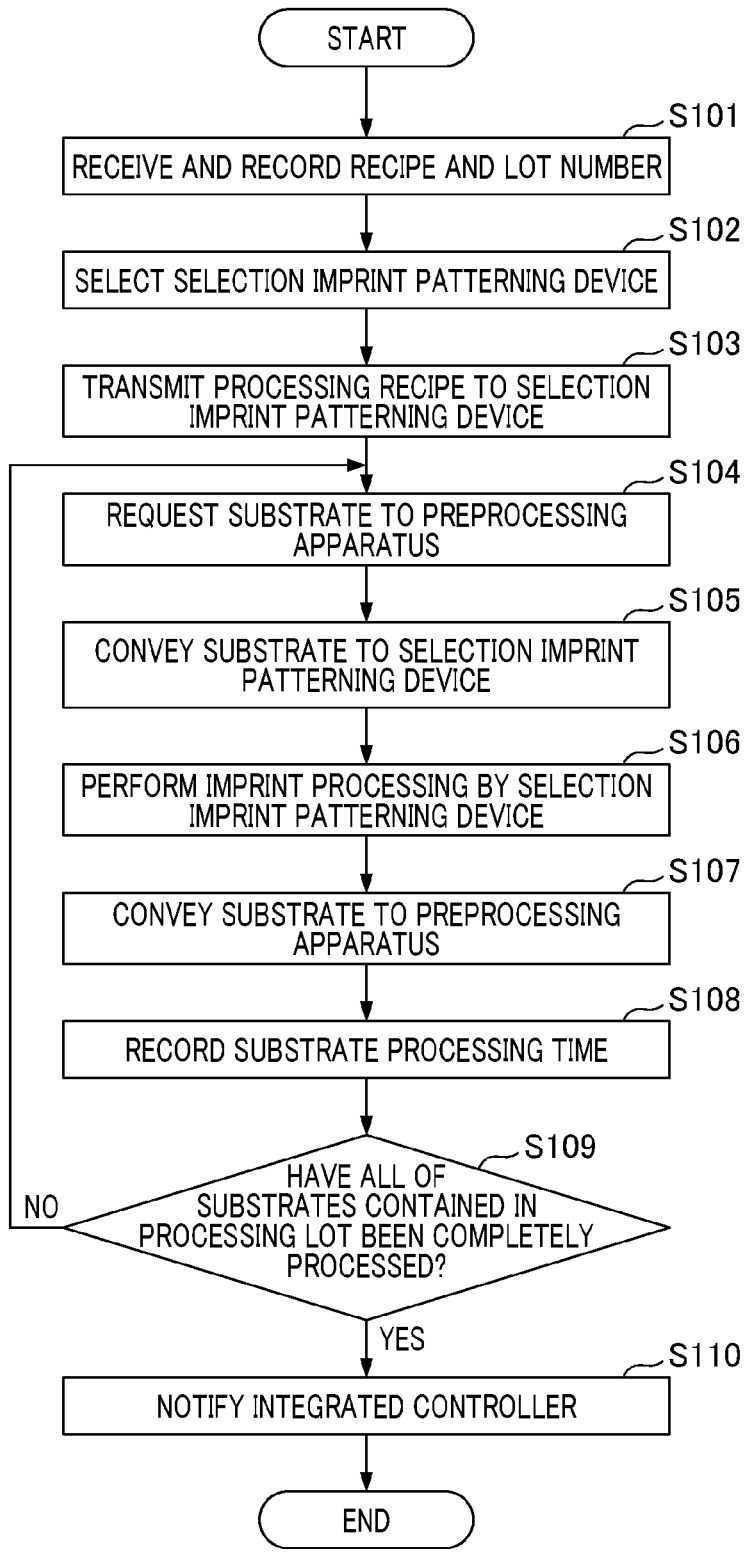
FIG. 7 is a flowchart illustrating cluster configuration imprint processing.

FIG. 7 is a flowchart illustrating processing (hereinafter referred to as "cluster configuration imprint processing") performed by the cluster controller 6 for a request from the integrated controller 10. Firstly, the cluster controller 6 receives the lot number of a lot (processing lot) to be next processed and a recipe (processing recipe) to be applied to the lot from the integrated controller 10 (step S101). The cluster controller 6 records the received processing recipe in the recipe storage 303. Next, the cluster controller 6 selects a patterning device 4 (hereinafter referred to as "selection patterning device") for performing processing for the processing lot received in step S101 (step S102). More specifically, at this time, the cluster controller 6 selects a selection patterning device (hereinafter, a description will be given by taking an example of the patterning device 4A as a selection patterning device) from the patterning devices 4 which do not perform processing with reference to the state storage 302 provided in the cluster controller 6. Here, when all the patterning devices 4 are processing the processing lots, the cluster controller 6 stands by until any one of the patterning devices 4 has completed lot processing. Then, the cluster controller 6 records a state, a recipe name, a recipe start time, and a lot number in the item (e.g. "the imprint patterning device 1") of the selection patterning device 4A for the state storage 302. Note that, when a patterning device 4 which is responsible for processing the wafer 101 is specifically designated by the integrated controller 10 and the cluster controller 6 also receives information about the designated patterning device 4 in step S101, the cluster controller 6 sets the designated patterning device 4 as the selection patterning device. Next, the cluster controller 6 transmits a processing recipe to the selection patterning device 4A selected in step S102 (step S103). Next, the cluster controller 6 requests the wafers 101 in the processing lot from the preprocessing apparatus 3 (step S104). Next, the cluster controller 6 causes the substrate convey unit 5 to convey the wafer (target wafer) 101 to be processed from the preprocessing apparatus 3 to the selection patterning device 4A (step S105). At this time, the cluster controller 6 further records a substrate number and a substrate start time in the item of the selection patterning device 4A for the state storage 302. Next, the cluster controller 6 causes the selection patterning device 4A to perform imprint processing for the target wafer 101 (step S106). Next, after completion of the imprint processing in step S106, the cluster controller 6 causes the substrate convey unit 5 to carry out the processed target wafer 101 from the selection patterning device 4A and to convey the processed target wafer 101 to the preprocessing apparatus 3 (step S107). Next, the cluster controller 6 records a substrate processing time taken for the target wafer 101 from steps S105 to S107 and its recipe name as item data of the selection patterning device for the history storage 304 (step S108). Next, the cluster controller 6 determines whether or not the processes from steps S104 to S109 have been completed for all of the wafers 101 contained in the processing lot (step S109). Here, when the cluster controller 6 determines that the processes from steps S104 to S109 have been completed for all of the wafers 101 contained in the processing lot (YES in step S109), the process shifts to step S110, whereas when the cluster controller 6 determines that the processes from steps S104 to S109 have not been completed for all of the wafers 101 contained in the processing lot (NO in step S109), the cluster controller 6 executes the processes in step S104 and subsequent steps for the next wafer 101 contained in the processing lot. Then, the cluster controller 6 notifies the integrated controller 10 of the fact that imprint processing for the processing lot has been completed (step S110). Here, the cluster controller 6 updates information (state) about the item of the selection patterning device for the state storage 302.

On the other hand, the cluster controller 6 executes processing (hereinafter referred to as "substrate request schedule transmission processing") for transmitting a substrate request schedule to the preprocessing apparatus 3 in parallel with the above cluster configuration imprint processing. Here, the term "substrate request schedule" refers to information including a timing at which the cluster controller 6 requests the wafer 101 from the preprocessing apparatus 3. The substrate request schedule transmission processing may be executed, for example, at a timing (corresponding to step S105 or step S108 in FIG. 7) at which any one of the patterning devices 4 starts or ends processing for the wafer 101. The substrate request schedule transmission processing may also be executed at a predetermined time interval.

Figure 8:
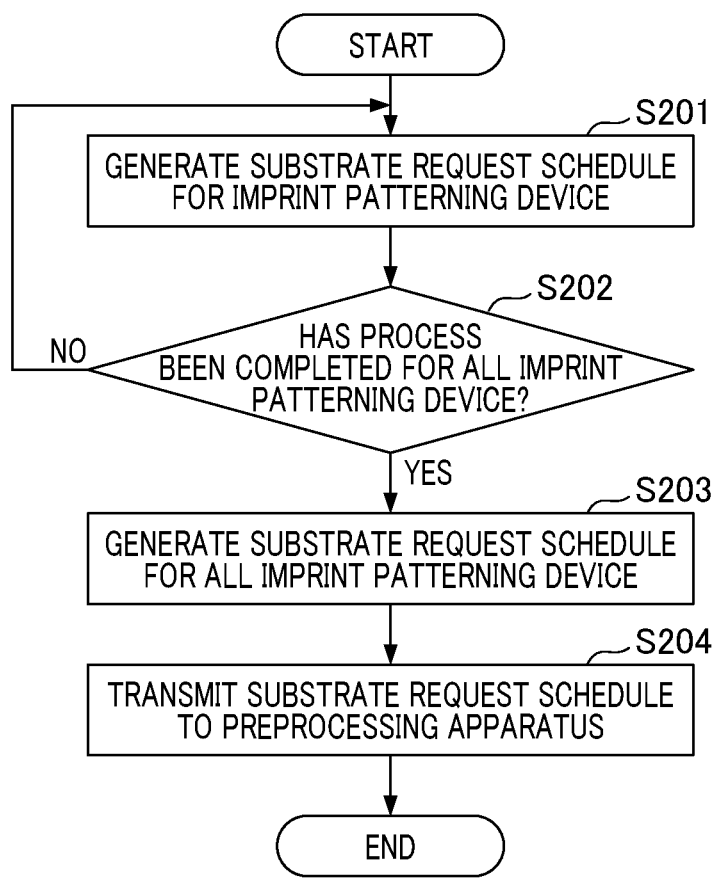
FIG. 8 is a flowchart illustrating substrate request schedule transmission processing.

FIG. 8 is a flowchart illustrating substrate request schedule transmission processing. Firstly, the cluster controller 6 generates a substrate processing schedule for each of the patterning devices 4 (step S201). More specifically, the cluster controller 6 firstly references recipes in process by the patterning devices 4 from the recipe storage 303 so as to estimate a processing time for each of the wafers 101. Then, the cluster controller 6 can generate a schedule for requesting the subsequent wafers 101 based on the states of the patterning devices 4 referenced from the state storage 302 and the estimated processing times required for the wafers 101. Next, the cluster controller 6 determines whether or not the process in step S201 has been completed for all of the patterning devices 4 (step S202). Here, when the cluster controller 6 determines that the process in step S201 has been completed for all of the patterning devices 4 (YES in step S202), the process shifts to step S203, whereas when the cluster controller 6 determines that the process in step S201 has not been completed for all of the patterning devices 4 (NO in step S202), the process in step S201 is repeated until it is completed for all of the patterning devices 4. Next, the cluster controller 6 arranges the substrate request timings of the patterning devices 4 generated in step S201 in temporal order so as to generate the substrate request schedule for all of the patterning devices 4 (step S203).

Figure 9:
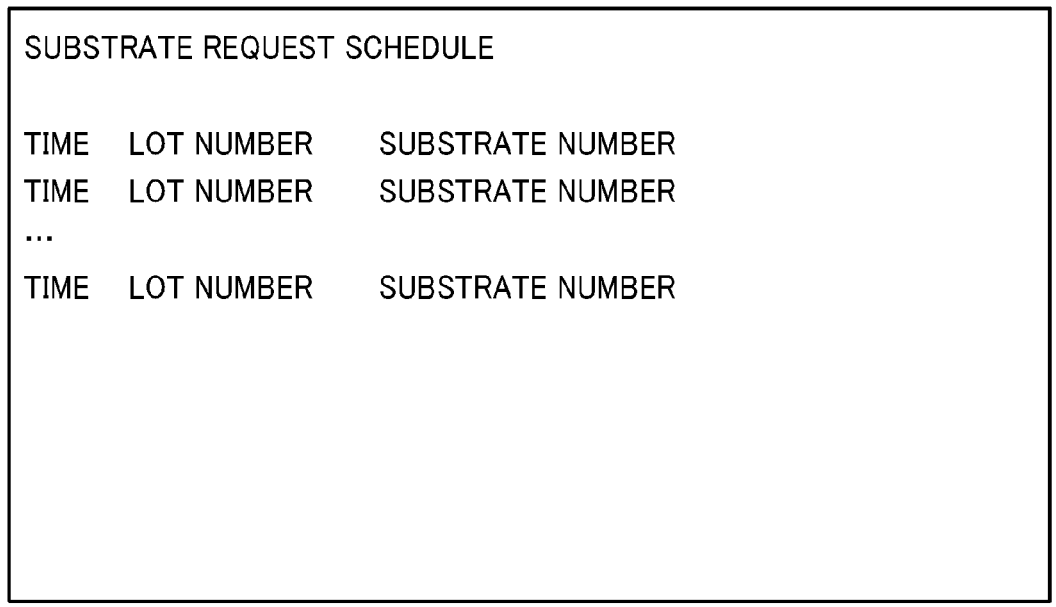
FIG. 9 is a diagram illustrating data recorded in a substrate request schedule.

FIG. 9 is a diagram illustrating an exemplary substrate request schedule. The substrate request schedule is data including a time for requesting a wafer 101, a lot number of the wafer 101 to be requested, and a substrate number in a lot for each of the requests of the wafers 101. While a lot number is transmitted to the preprocessing apparatus 3 in this example, a number indicating a patterning device 4, for example, instead of a lot number may also be transmitted to the preprocessing apparatus 3 if the preprocessing apparatus 3 records and manages the relationship between a lot and a patterning device 4 for processing the lot.

Then, the cluster controller 6 transmits the substrate request schedule to the preprocessing apparatus 3 (step S204). While the substrate request schedule is generated from a recipe in process by each of the patterning devices 4 in this example, the substrate request schedule may also be generated, for example, by referencing the past processing time taken upon execution of the same recipe of the same patterning device 4 from the history storage 304.

Figure 10:
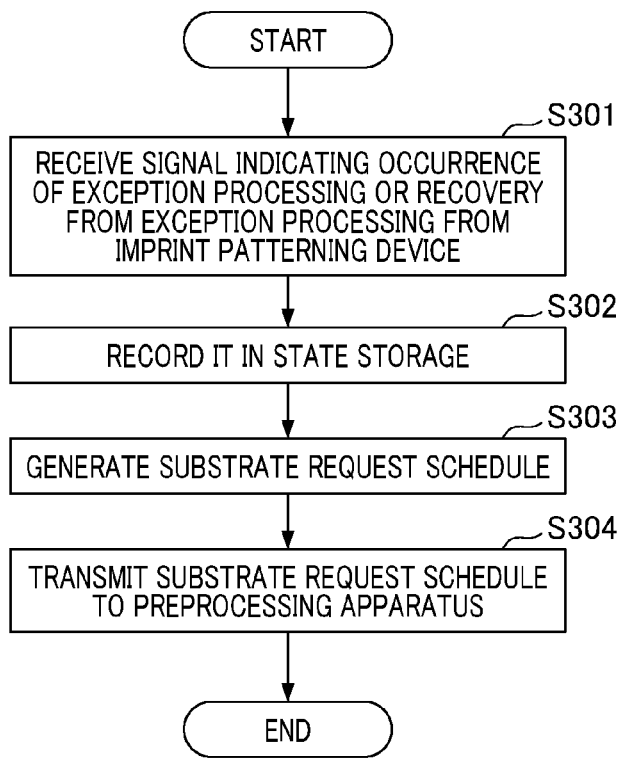
FIG. 10 is a flowchart illustrating exceptional processing or processing related to exceptional processing.

Next, a description will be given of processing (hereinafter referred to as "exceptional processing or processing related to exceptional processing") performed when exception processing such as incapable of detecting an alignment mark occurs in each patterning device or when each patterning device recovers from exception processing. FIG. 10 is a flowchart illustrating exceptional processing or processing related to exceptional processing. Firstly, the cluster controller 6 receives a signal indicating the occurrence of exception processing or a recovery from exception processing from the patterning device 4 in which exception processing occurs or the patterning device 4 which recovers from exception processing (step S301). Next, the cluster controller 6 records the fact that the patterning device 4 in question has stopped or recovered in the state storage 302 (step S302). Next, the cluster controller 6 generates the substrate request schedule in the same procedure from step S201 to step S202 in FIG. 8 (step S303). Here, when exception processing occurs, the request of the wafer 101 from the patterning device 4 in question is deleted. Then, the cluster controller 6 transmits the new substrate request schedule again to the preprocessing apparatus 3 (step S304).

As described above, the cluster-type imprint apparatus 2 transmits the substrate request schedule which is most efficient for each of the patterning devices 4 from the viewpoint of a processing time to the preprocessing apparatus 3, resulting in an improvement in productivity in the entire cluster-type imprint apparatus 2. Furthermore, the preprocessing apparatus 3 may also perform coating of an adherence layer, for example, immediately before processing performed by the patterning devices 4 as close as possible by using the substrate request schedule. Thus, the cluster-type imprint apparatus 2 may also suppress a reduction in yield.

As described above, according to the present embodiment, a lithography apparatus, a lithography method, and a lithography system which may ensure a good yield and productivity in the case of a cluster configuration may be provided.

While, in the above description, the cluster controller 6 transmits the substrate request schedule to the preprocessing apparatus 3, the cluster controller 6 may also transmit the substrate request schedule, for example, to an external device such as the integrated controller 10 so that a preprocessing start timing of the preprocessing apparatus 3 may be controlled by the external device. While, in the above description, each of the patterning devices 4 includes one imprint structure 105, each of the patterning devices 4 may also include a plurality of imprint structures. In this case, it is preferable that the wafers 101 in the same lot are subject to imprint processing by the same imprint structure.

Furthermore, the above description has been given by taking an example of a cluster-type imprint apparatus including a plurality of imprint patterning devices (imprint apparatuses) as lithography apparatuses. The present invention is not limited thereto but may also be applicable to a cluster-type drawing apparatus or the like including a plurality of drawing processing devices (drawing apparatuses) that perform drawing processing for a substrate (photosensitizer on a substrate) using charged particle beams such as electron beams.

(Article Manufacturing Method)

An article manufacturing method according to an embodiment of the present invention is preferred in manufacturing an article such as a micro device such as a semiconductor device or the like, an element or the like having a microstructure, or the like. The article manufacturing method may include a step of forming a pattern (e.g., latent image pattern) on an object (e.g., substrate on which a photosensitive material is coated) using the aforementioned lithography apparatus; and a step of processing (e.g., step of developing) the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-150054 filed on Jul. 19, 2013, which is hereby incorporated by reference herein in its entirety.

What is claimed is:

1. A lithography apparatus comprising:
a first patterning device configured to perform patterning of a substrate;
a second patterning device configured to perform patterning of a substrate; and
a controller configured to:
cause the first and second patterning devices to perform parallel processings in which the first patterning device performs patterning of a first substrate belonging to a first lot based on recipe information for the first substrate, and the second patterning device performs patterning of a second substrate belonging to a second lot different from the first lot based on recipe information for the second substrate; and
transmit information regarding the parallel processing that includes a timing for requesting for the substrate to a preprocessing apparatus configured to supply the substrate to the first and second patterning devices.

2. The apparatus according to claim 1, further comprising at least one patterning device configured to perform patterning of a substrate.

3. The apparatus according to claim 1, further comprising a robot configured to respectively convey the first and second substrates to the first and second patterning devices based on information regarding a schedule of the parallel processings.

4. The apparatus according to claim 1, wherein the controller is configured to generate information regarding a schedule of the parallel processings based on a first processing time required for the first patterning device to process the first lot and a processing time required for the second patterning device to process the second lot.

5. The apparatus according to claim 4, wherein the controller is configured to obtain the first processing time based on recipe information for the first lot and a state of the first patterning device.

6. The apparatus according to claim 4, wherein the controller is configured to obtain the first processing time based on information of an actual value for the first processing time.

7. The apparatus according to claim 1, wherein the controller is configured to update information regarding a schedule of the parallel processings based on one of a state of a processing performed by the first patterning device and a state of a processing performed by the second patterning device, and transmit the updated information to a preprocessing apparatus for the first and second substrates.

8. The apparatus according to claim 1, wherein the controller is configured to transmit information regarding a schedule of the parallel processings to an information processing apparatus connected to the lithography apparatus and a preprocessing apparatus for the first and second substrates.

9. The apparatus according to claim 1, wherein the first and second patterning devices include a patterning device configured to perform an imprint processing.

10. The apparatus according to claim 1, wherein the first and second patterning devices include a patterning device configured to perform patterning with a charged particle beam.

11. A lithography method of performing patternings of substrates using first and second patterning devices, the method comprising:

conveying a first substrate belonging to a first lot to the first patterning device and conveying a second substrate belonging to a second lot different from the first lot to the second patterning device based on information regarding a schedule of parallel processings in which the first patterning device is to perform patterning of the first substrate based on recipe information for the first substrate, and the second patterning device is to perform patterning of the second substrate based on recipe information for the second substrate;

preprocessing the first and second substrates based on the information and information regarding the conveying; and performing the parallel processings.

* * * * *